(12) United States Patent
Worones et al.

(10) Patent No.: US 8,093,516 B2
(45) Date of Patent: Jan. 10, 2012

(54) DIGITAL MULTIMETER HAVING IMPROVED ROTARY SWITCH ASSEMBLY

(75) Inventors: Jeffrey E. Worones, Seattle, WA (US); Terry G. Morey, Renton, WA (US)

(73) Assignee: Fluke Corporation, Everett, WA (US)

( * ) Notice: Subject to any disclaimer, the term of this patent is extended or adjusted under 35 U.S.C. 154(b) by 367 days.

(21) Appl. No.: 11/893,109

(22) Filed: Aug. 14, 2007

(65) Prior Publication Data

US 2009/0045038 A1 Feb. 19, 2009

(51) Int. Cl.
*H01H 3/00* (2006.01)
(52) U.S. Cl. .................................. 200/11 DA; 200/11 R
(58) Field of Classification Search ............. 200/11 DA, 200/11 D, 11 R, 11 J, 11 K, 11 G, 14, 17 R, 200/18
See application file for complete search history.

(56) References Cited

U.S. PATENT DOCUMENTS

| | | | |
|---|---|---|---|
| 3,031,541 A | 4/1962 | Hoffmann | |
| 3,996,440 A | 12/1976 | Niconienko | |
| 4,131,771 A | 12/1978 | Erickson et al. | |
| 4,166,200 A * | 8/1979 | Reichen et al. ............. | 200/11 R |
| 5,442,337 A * | 8/1995 | Hwang .......................... | 340/635 |
| 6,043,640 A | 3/2000 | Lauby et al. | |
| 6,466,003 B1 | 10/2002 | Gallavan et al. | |
| 7,034,517 B2 | 4/2006 | Newcombe | |

FOREIGN PATENT DOCUMENTS

| | | |
|---|---|---|
| DE | 2646526 A1 | 4/1978 |
| DE | 3611554 A1 | 5/1987 |
| DE | 3630457 A1 | 3/1988 |
| DE | 4323083 | 1/1995 |
| DE | 29506697 U1 | 8/1995 |
| EP | 0070629 | 1/1983 |
| GB | 911472 A | 11/1962 |
| GB | 4499381 | 2/1978 |
| JP | 200199872 | 4/2001 |
| JP | 2001216858 A | 8/2001 |
| SU | 987533 A1 | 1/1983 |

OTHER PUBLICATIONS

U.K. Intellectual Property Office Search Report dated Jul. 18, 2008 for corresponding application filed in the U.K.
Pending U.S. Appl. No. 11/977,078, filed Oct. 23, 2007.
Pending U.S. Appl. No. 11/893,093, filed Aug. 14, 2007.
Pending U.S. Appl. No. 11/893,092, filed Aug. 14, 2007.
Pending U.S. Appl. No. 11/893,122, filed Aug. 14, 2007.
Description of Prior Art Multimeter Switch marketed prior to Aug. 2006.
U.K. Search Reports issued Oct. 2, 2008 and Oct. 3, 2008 for corresponding U.K. Application.

(Continued)

*Primary Examiner* — Renee Luebke
*Assistant Examiner* — Marina Fishman
(74) *Attorney, Agent, or Firm* — Nelson Mullins Riley & Scarborough LLP

(57) ABSTRACT

A multimeter includes a case having a rotary selector knob for selecting a multimeter function. A circuit board defining multiple switching terminals thereon is located in the case. A rotary switch assembly is operatively coupled to the selector knob. The rotary switch assembly has a plurality of contact pairs which selectively complete a galvanic connection across predetermined pairs of switching terminals. The rotary switch assembly further includes first and second switch members located in opposition on respective sides of the circuit board. Each of the switch members has at least one of the contact pairs.

19 Claims, 7 Drawing Sheets

OTHER PUBLICATIONS

English Translation of the First Office Action issued by the Chinese Patent Office on Nov. 8, 2010 regarding corresponding application No. 200810099541.9.

English Translation of Office Action issued by German Patent Office on Jun. 22, 2011 regarding corresponding German application No. 10 2008 034 537.7.

English Translation of Second Office Action issued by Chinese Patent Office regarding corresponding application No. 200810099541.9.

Examination Report issued by the UK Patent Office on Oct. 20, 2011 for corresponding UK application No. 0806371.1.

* cited by examiner

DIGITAL MULTIMETER HAVING IMPROVED ROTARY SWITCH ASSEMBLY

BACKGROUND OF THE INVENTION

The present invention relates generally to digital multimeters. More particularly, the invention relates to a digital multimeter having an improved rotary switch assembly.

Digital multimeters (DMMs) function to measure a number of electrical parameters as needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary knob by which various functions are selected. A plurality of lead jacks are provided in the case (i.e., housing) of the unit for connection of test leads. The specific jack used may depend on the function that has been selected. An LCD display provides a reading of the tested parameter.

Various electronic components are mounted to a printed circuit board located inside the case of the DMM. A rotary switch having multiple contact pairs may be mounted to the printed circuit board. When the selector knob is rotated by a user, the contact pairs are moved into or out of engagement with pairs of contact terminals located on the surface of the printed circuit board itself. As a result, a galvanic connection between the terminal pairs will be made as necessary for the selected function. The terminal pairs are formed through suitable printed circuit technology as conductive pads on the printed circuit board.

Details regarding the construction and operation of multimeters may be discerned from U.S. Pat. Nos. 7,034,517, 6,466,003 and 6,043,640, incorporated herein by reference.

SUMMARY OF THE INVENTION

According to one aspect, the present invention provides a multimeter comprising a case having a rotary selector knob for selecting a multimeter function. A circuit board defining multiple switching terminals thereon is located in the case. A rotary switch assembly is operatively coupled to the selector knob. The rotary switch assembly has a plurality of contact pairs which selectively complete a galvanic connection across predetermined pairs of switching terminals. The rotary switch assembly further includes first and second switch members located in opposition to one another on respective sides of the circuit board. Each of the switch members has at least one of the contact pairs.

In presently preferred embodiments, the rotary switch assembly includes a shaft interconnecting the first and second switch members. The shaft is configured such that the first switch member and the second switch member are interconnected in a predetermined angular orientation.

Often, it will be desirable for the first switch member to include at least four contact pairs. Similarly, the second switch member may include at least three contact pairs. In addition, the second switch member may also have a nonfunctional sweeper operative to facilitate balance during rotation. For example, the nonfunctional sweeper may include a pair of parallel sweeper members.

Exemplary embodiments may include a detent disc located on an inside surface of the case. In such embodiments, the detent disc may interconnect the selector knob and first switch member for rotation about a common rotational axis. In this regard, the selector knob may include a coupling structure engaging the detent disc such that the selector knob and detent disc rotate together. The detent disc and first switch member may be interconnected via a plurality of drive pins offset from but parallel to the common rotational axis. Preferably, the detent disc and first switch member may each include a visual alignment feature to facilitate assembly.

According to exemplary embodiments, each of the first and second switch members may comprise a support disc in which the contact pairs are carried. The support disc in such embodiments may be formed of a polymeric material. A least one punch-out aperture may be provided in the support disc at which adjacent contact pairs are disconnected.

According to an additional aspect, the present invention provides a method of forming a rotary switch member for use in a multimeter. One step of the method involves providing a unitary metallic element defining a plurality of contact pairs wherein adjacent contact pairs are interconnected by a strip. At least two of the contact pairs are oriented in different directions. Another step involves encapsulating portions of the unitary metallic element with a polymeric material such that end portions of the contact pairs and at least part of each strip remain exposed. A further step of the method involves removing a portion of each strip to prevent galvanic connection between adjacent contact pairs.

Additional aspects of the present invention are provided by a rotary switch assembly for use in an electronic metering device. The assembly comprises a selector knob and a generally planar substrate board having conductive pads thereon defining multiple switching terminals. First and second switch members are located on respective sides of the substrate board. The switch members are operatively connected to the selector knob for rotation about a common rotational axis. Each of the switch members is configured having a support disc formed of a polymeric material in which a plurality of contact pairs are carried. The contact pairs are operative to complete a galvanic connection across predetermined pairs of the switching terminals.

In presently preferred embodiments, the first and second switch members are interconnected via a shaft extending through the substrate board along the common rotational axis. Preferably, the shaft is configured such that the first and second switch members are interconnected in a predetermined angular orientation.

Additional aspects of the present invention are achieved by a rotary switch assembly for use in an electronic metering device. The assembly comprises a selector knob and a generally planar substrate board having conductive pads thereon defining multiple switching terminals. A first switch member, located on the substrate board, has a support disc formed of a polymeric material in which a plurality of contact pairs are carried. The contact pairs of the first switch member are operative to complete a galvanic connection across predetermined pairs of switching terminals. A detent disc interconnects the selector knob and first switch member for rotation about a common rotational axis. The detent disc and first switch member each include a visual alignment feature to facilitate assembly.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
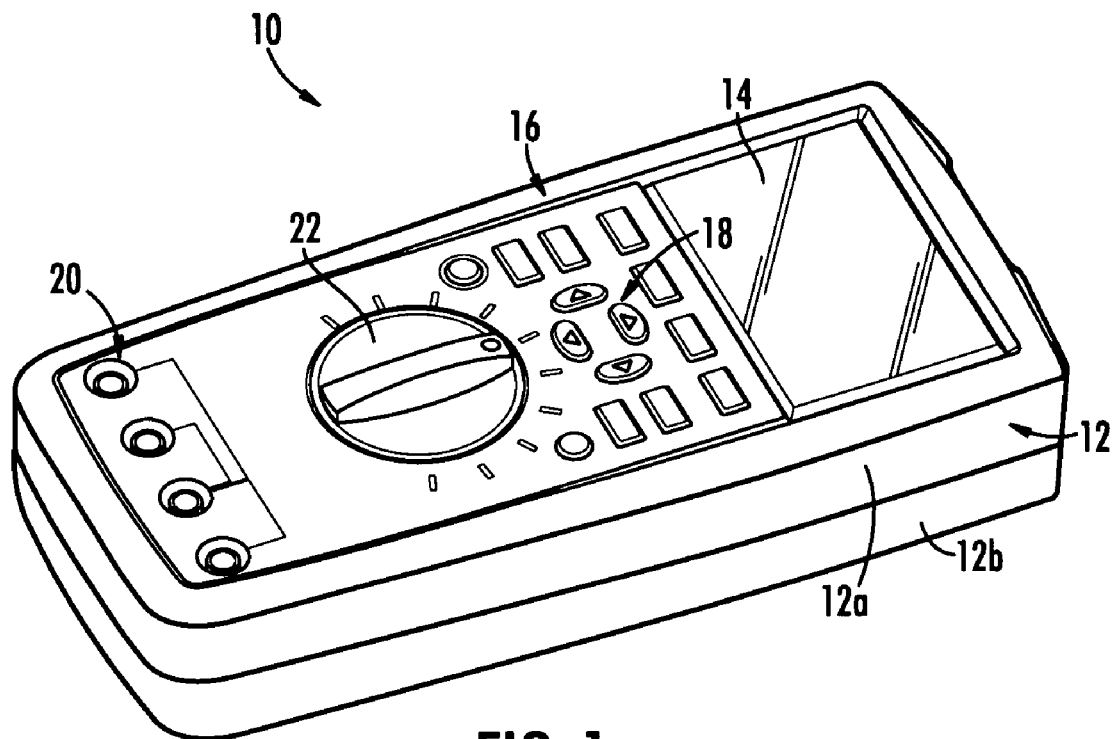
FIG. 1 is a perspective view of a digital multimeter constructed in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with the present invention. Multimeter 10 comprises a housing in the form of a case 12 defining an interior cavity in which various internal components are located. A suitable display, such as a liquid crystal display (LCD), can be viewed through a transparent window 14 located in the top surface of case 12. A plurality of keys (collectively indicated at 16) provide a user interface. As shown, these keys may include directional navigation buttons as indicated at 18. A plurality of jacks for connection of respective test leads are also provided, as collectively indicated at 20.

A rotary selector knob 22 allows the user to select a particular multimeter function. In this case, ten such functions are provided, indicated by respective stop positions in the knob rotation. As one skilled in the art will appreciate, suitable graphics will typically be printed on the top surface of case 12 to indicate the respective function.

Figure 2:
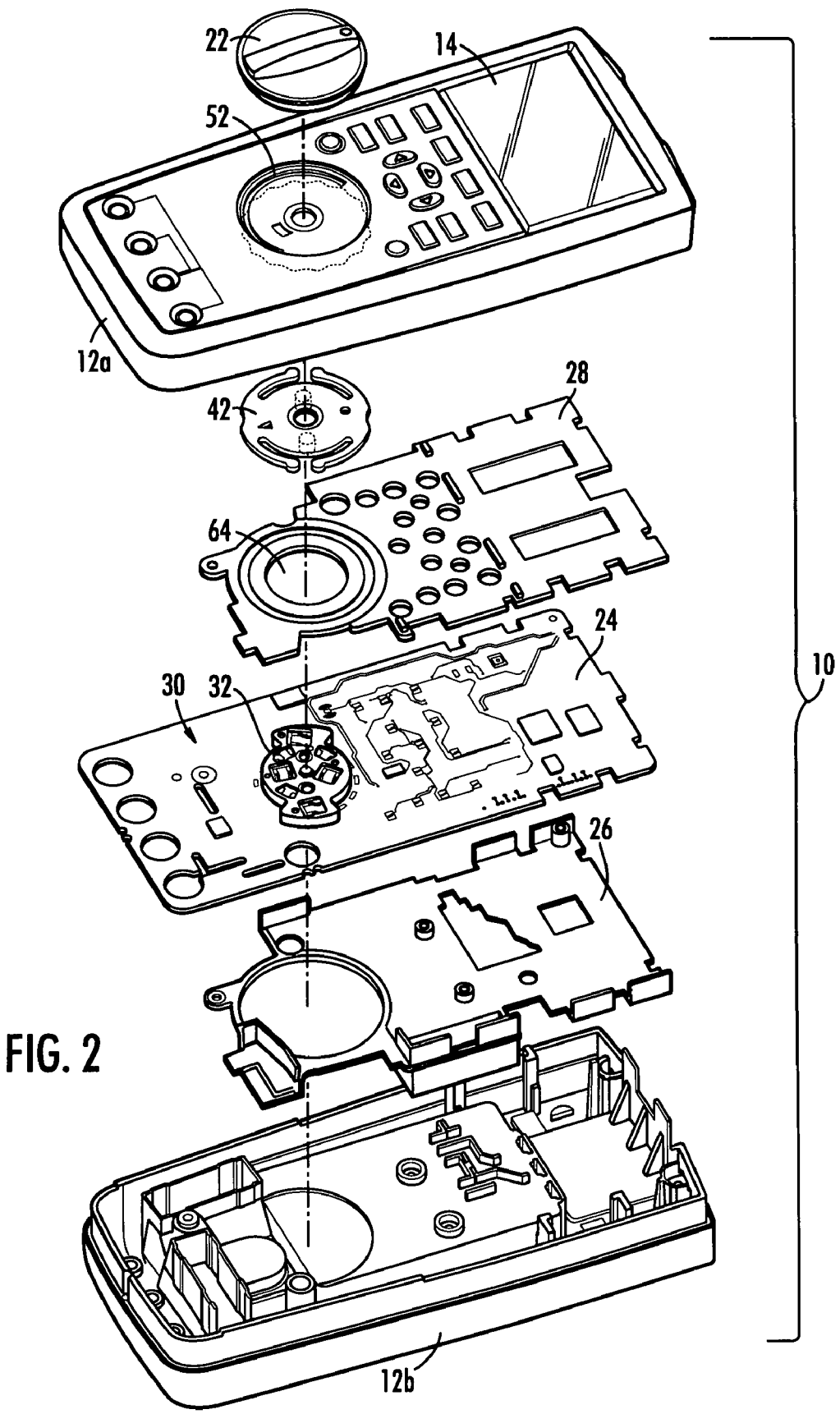
FIG. 2 is an exploded view showing various components of the multimeter of FIG. 1.

Certain additional details about the construction of multimeter 10 can be most easily explained with reference to FIG. 2. In this embodiment, case 12 is preferably formed having top and bottom case members 12a and 12b which together define the interior cavity. Preferably, each of the case members 12a and 12b may be formed of a molded shell of high impact rigid plastic which is at least partially overmolded with a softer polymeric material. The softer material provides a desirable gripping surface. The molded shell of the bottom case member may be opaque, whereas embodiments are contemplated in which the molded shell of the top case member is transparent. An opaque "skin" may be applied to the top case member to cover areas not already covered by the overmold that should not be transparent.

Various electronic components necessary for operation of multimeter 10 are mounted to a circuit board 24 within the interior cavity. Portions of circuit board 24 are covered by a bottom shield 26 and a top shield 28 to reduce the effects of interference on the operation of multimeter 10.

Figure 3:
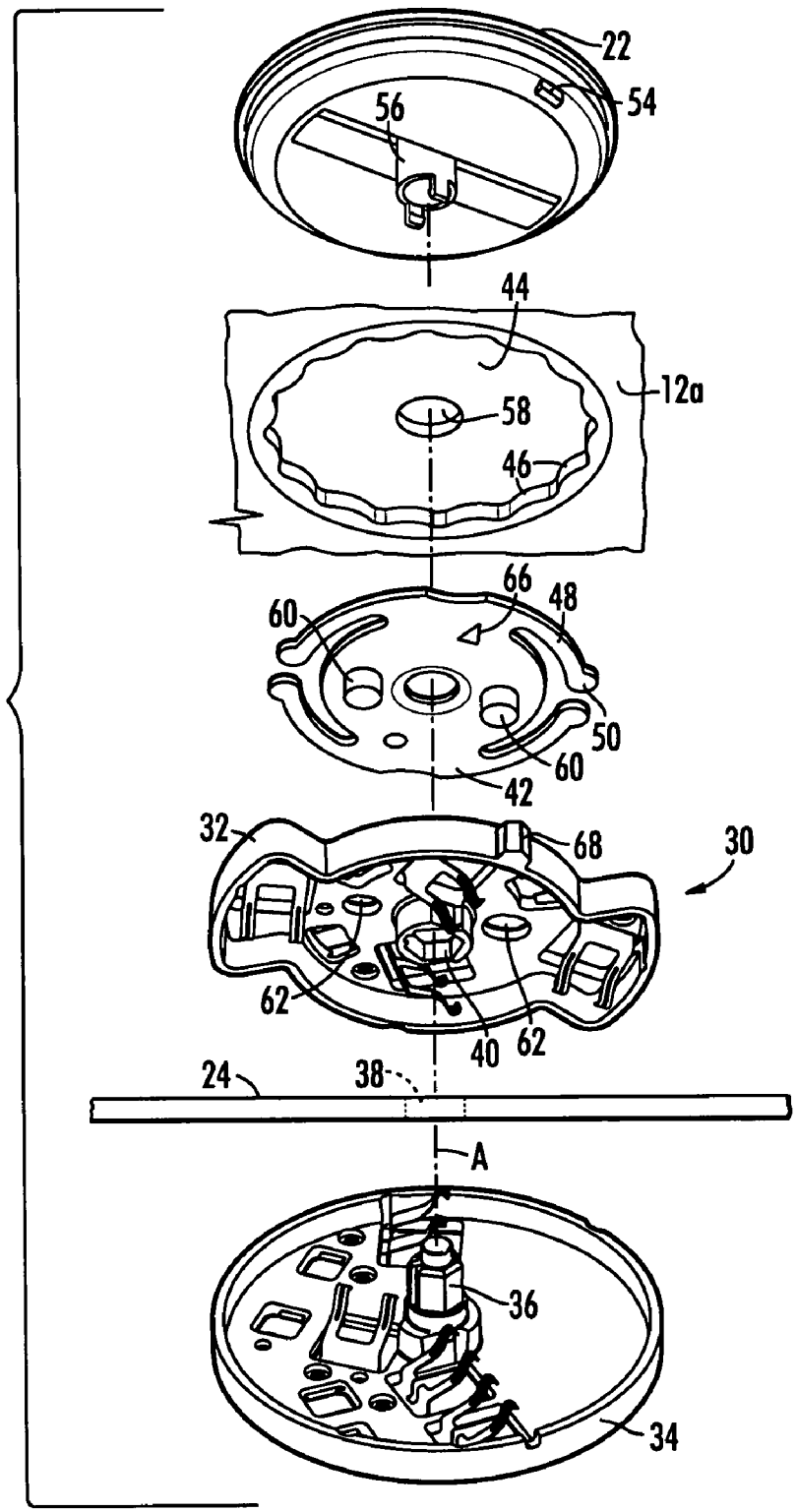
FIG. 3 is an enlarged exploded view of various components of a rotary switch assembly utilized in the multimeter of FIG. 1.
Figure 4:
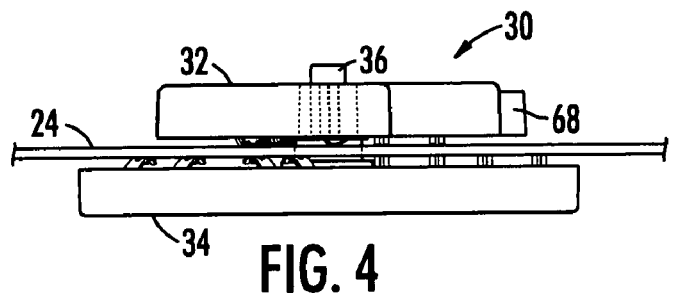
FIG. 4 is a side elevation showing first and second rotary switch members of the rotary switch assembly as mounted to a circuit board.

Multimeter 10 includes a rotary switch assembly by which circuit board 24 "knows" the position of selector knob 22. Referring now to FIGS. 2-4, switch assembly 30 in this embodiment includes a first switch member 32 and a second switch member 34 opposed to one another on the top and bottom sides, respectively, of circuit board 24. In this case, switch member 34 includes a shaft 36 extending through an aperture 38 defined in circuit board 24. Shaft 36 is received in a corresponding bore 40 defined in the center of switch element 32.

Preferably, shaft 36 includes a key received in a corresponding keyway defined in bore 40. As a result, switch members 32 and 34 will be situated in the correct angular orientation during the assembly process. In addition, shaft 36 and bore 40 may define a series of flats which further prevent relative rotation between switch members 32 and 34. An appropriate locking feature may be provided having a tendency to maintain the interconnection between switch members 32 and 34 after they are connected together.

A detent mechanism is used to divide rotation of selector knob 22 into discrete increments. As a result, selector knob 22 will remain in the selected position until the user intentionally moves the knob to a new position. In this embodiment, the detent mechanism comprises a detent disc 42 located in a recess 44 defined on the inside surface of case member 12a. Recess 44 defines a series of "teeth" 46 around its circumference. The teeth 46 are engaged by protuberances located at the end of respective springs (such as spring 48 and its protuberance 50) formed as an integral extension of detent disc 42. As one skilled in the art will recognize, the springs urge the respective protuberance into the valley between adjacent teeth 46.

A stop feature is preferably provided to limit rotation of knob 22 in both clockwise and counterclockwise directions. In this case, the stop feature comprises an arcuate groove 52 (FIG. 2) defined in the housing. Groove 52 receives a protrusion 54 (FIG. 3) located on the bottom of selector knob 22. When protrusion 54 gets to the end faces of groove 52, further rotation is prevented.

As shown in FIG. 3, selector knob 22 includes a depending shaft 56 that extends through an aperture 58 defined in case member 12a. Shaft 56 couples selector knob 22 to detent disc 42 such that they rotate together. In addition, detent disc 42 includes a pair of drive pins 60 received in respective drive holes 62 defined in the top of first switch member 32. As a result of this arrangement, rotation of selector knob 22 by a user will rotate detent disc 42, which in turn rotates switch assembly 30. In this embodiment, all of the components rotate around a common rotational axis A. Depending on the configuration of shield 28, an opening, such as circular opening 64, may be necessary to accommodate drive pins 60.

Detent disc 42 and switch member 32 may include visual indicators to ensure proper orientation during assembly. In this case, respective arrows 66 and 68 are provided for this purpose (see FIG. 3). The assembler knows that if the arrows are pointed in a particular direction, all of the rotational components will be oriented correctly with respect to one another.

Figure 5:
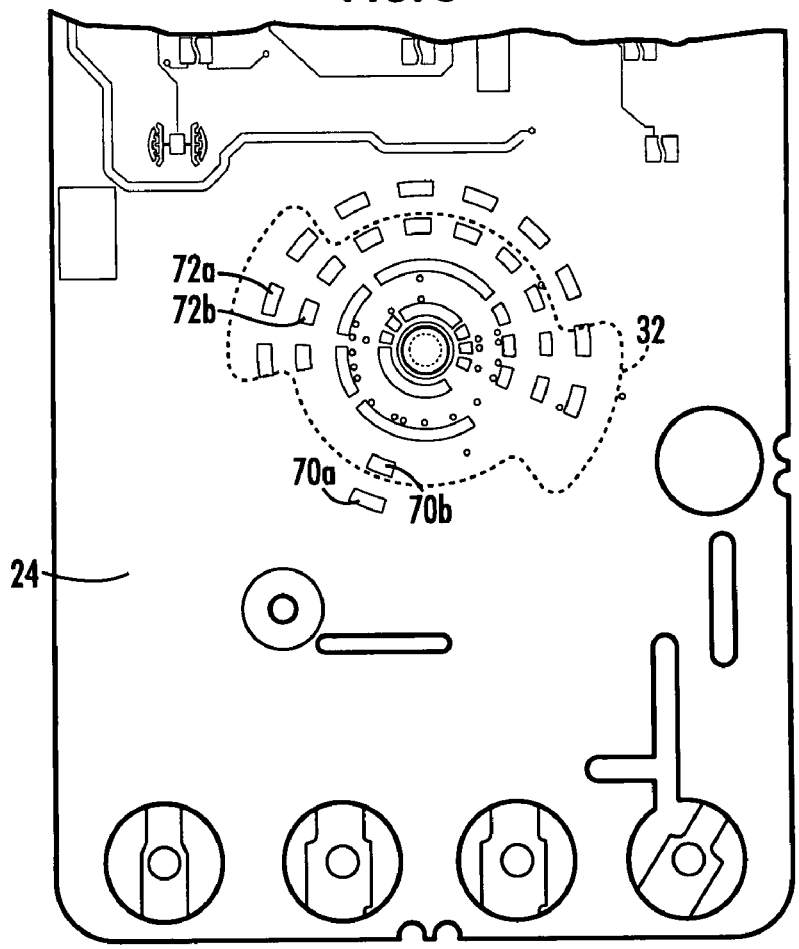
FIG. 5 is a plan view of a portion of the circuit board showing various terminal pairs thereon.

Referring to FIG. 5, circuit board 24 includes a plurality of switching terminals that are either open (nonconducting) or closed (conducting) depending on the position of switch members 32 and 34. The switching terminals are formed as conductive pads on both planar surfaces of circuit board 24. For example, one position of selector knob 22 may provide a galvanic connection across terminals 70a and 70b. Another position of selector knob 22 may provide a galvanic connection across terminals 72a and 72b. As a result, the function to be performed by multimeter 10 is selected.

Figure 6:
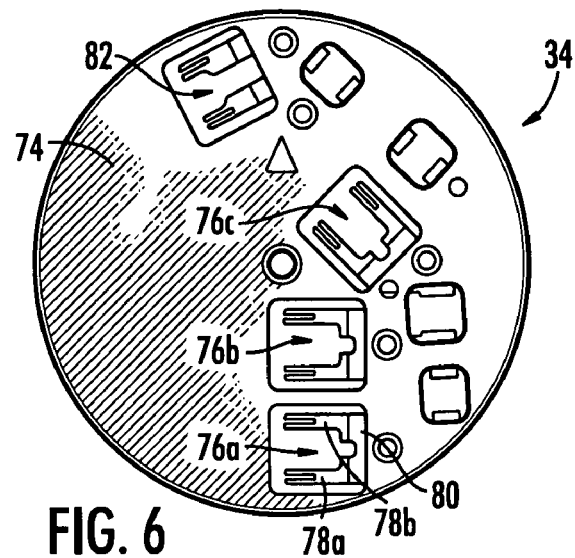
FIG. 6 is a plan view of the second rotary switch member showing an outer side thereof (i.e., the side away from the circuit board)
Figure 7:
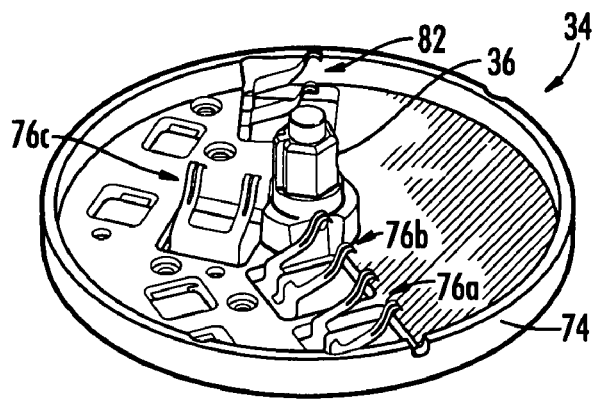
FIG. 7 is a perspective view of the second rotary switch member showing an inner side thereof (i.e., the side mounted toward the circuit board)

Additional details regarding the construction of second switch member 34 can be most easily explained with reference to FIGS. 6 and 7. As shown, switch member 34 comprises a support disc 74 in which a plurality of contact pairs 76a, 76b and 76c are carried. Support disc 74 is preferably formed of a suitable polymeric material such as an acceptable ABS/PC blend.

Contact pairs 78a-c are preferably formed from a suitable metal having the desired conductive and spring-like qualities. For example, presently preferred embodiments of the invention utilize beryllium copper which has been plated with nickel. As shown, each of the contact pairs 78a-c includes a pair of spring-like "fingers," such as fingers 78a and b, that are connected together at their proximal ends (as indicated at 80). The fingers will contact a respective terminal pad as the switch member is rotated.

Figure 8:
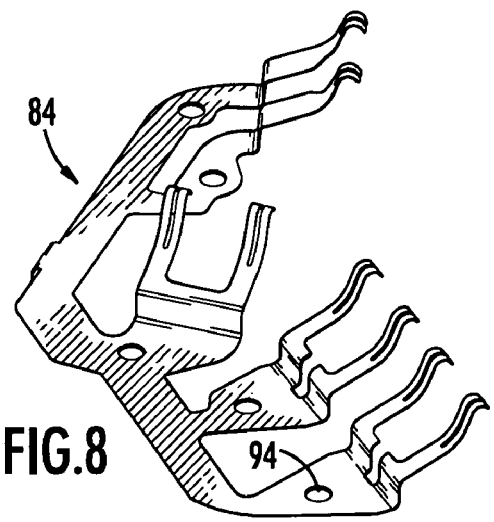
FIG. 8 is a perspective view of a unitary metallic element used in producing the second rotary switch member.

In this embodiment, switch member 34 also includes a "nonfunctional" sweeper 82. Sweeper 82 is "nonfunctional" in the sense that it does not serve as a switch armature, but instead functions to provide balance to switch member 34 during rotation. Specifically, sweeper 82 counteracts the upward spring force of contact pair 76a which might otherwise cause switch member 34 to tilt. As will be described in more detail below, contact pairs 76a-c and nonfunctional sweeper 82 may be advantageously formed from a unitary metallic element 84 (FIG. 8).

Figure 9:
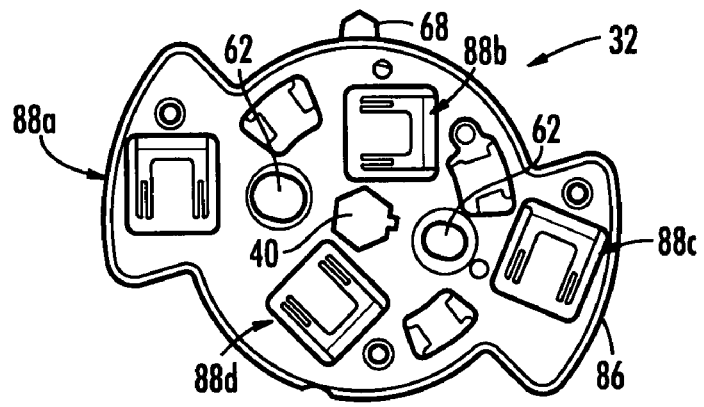
FIG. 9 is a plan view of the first rotary switch member showing an outer side thereof.
Figure 10:
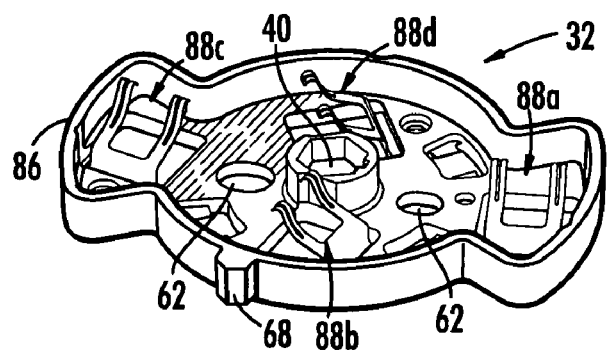
FIG. 10 is a perspective view of the first rotary switch member showing an inner side thereof.
Figure 11:
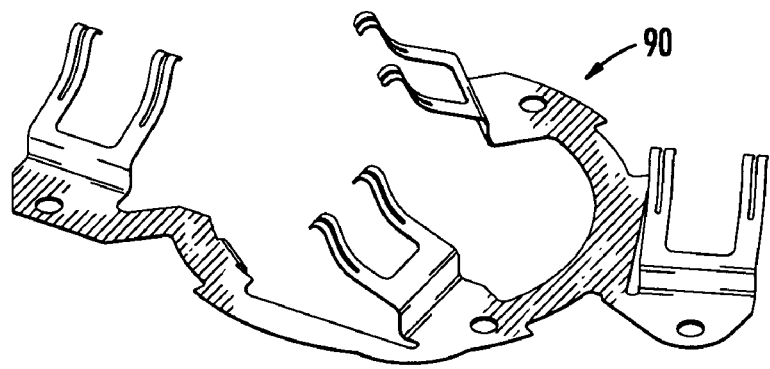
FIG. 11 is a perspective view of a unitary metallic element used in producing the first rotary switch member.

Referring now to FIGS. 9 and 10, first switch member 32 is also preferably formed having a support disc 86 in which a plurality of contact pairs 88a-d are carried. Like support disc 74, support disc 86 may be formed of a ABS/PC blend, or other suitable polymeric material. Contact pairs 88a-d are preferably produced from nickel-plated beryllium copper or other suitable conductive material. Contact pairs 88a-d may be formed from a unitary metallic element 90 (FIG. 11).

Figure 12:
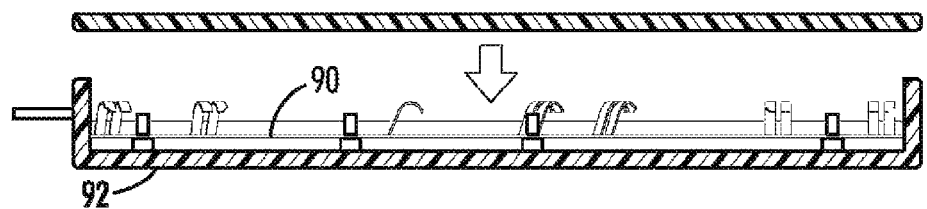
FIGS. 12-14 are diagrammatic illustrations showing various molding steps that may be used in producing a rotary switch member in accordance with the present invention.
Figure 13:
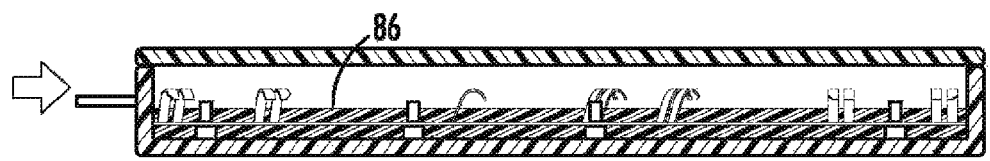
Figure 14:
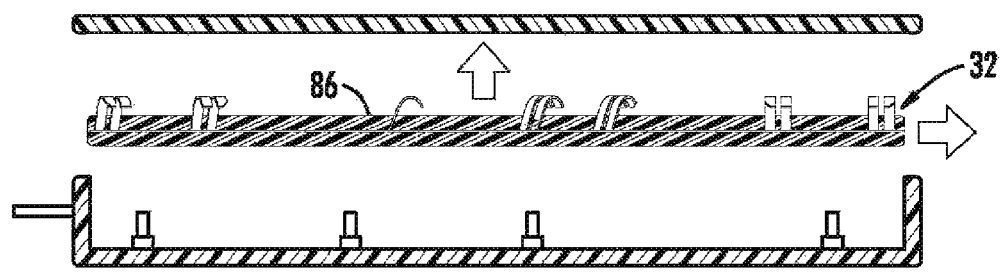

One exemplary process for producing a switch member according to the present invention will now be described with reference to the remaining figures. In this regard, FIGS. 12-14 diagrammatically illustrate a mold in which the support disc may be formed. In this case, the mold is configured to form support disc 86 of first switch member 32. Referring now to FIG. 12, unitary metallic element 90 is placed into a base 92 of the mold. Base 92 will include a suitable fixture ensuring the correct orientation of element 90. For example, element 90 may define a plurality of holes (FIG. 8 shows a similar hole 94 in element 84) that receive aligning pins located in the mold. After element 90 is placed in the correct orientation, the mold is closed, as shown in FIG. 13. The polymeric material is injected into the mold so as to surround selected regions of unitary metallic element 90 and thereby form support disc 86.

Once the polymeric material is suitably hardened, it can be removed from the mold as indicated in FIG. 14.

Figure 15:
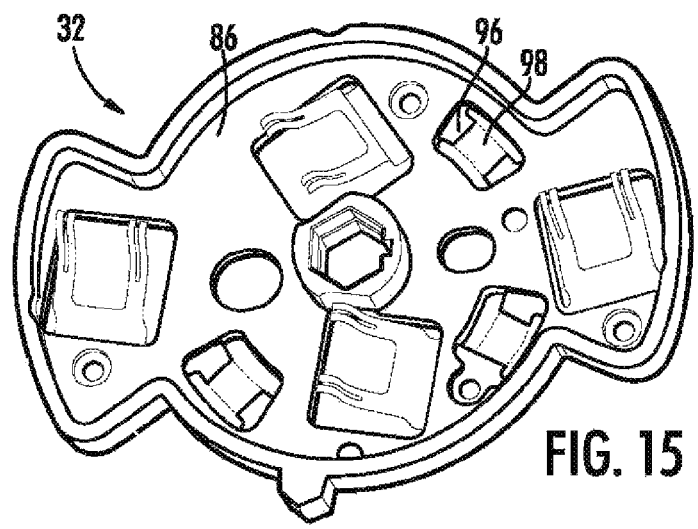
FIG. 15 is a perspective view showing the rotary switch member as it emerges from the mold in FIG. 14.

Referring now to FIG. 15, one skilled in the art will appreciate that all of the contact pairs are connected to one another when the switch member is removed from the mold. To interrupt a galvanic connection between the respective contact pairs, the support discs are provided with a number of punch-out apertures, such as punch-out aperture 96. These apertures expose the connecting strips between adjacent contact pairs so that at least a portion 98 of the strip can be removed. As a result, each of the contact pairs functions as an individual armature in the switch arrangement.

It can thus be seen that the present invention provides a digital multimeter having an improved rotary switch assembly. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising:
   a case having a rotary selector knob for selecting a multimeter function;
   a circuit board located in said case, said circuit board defining multiple switching terminals thereon;
   a rotary switch assembly operatively coupled with said selector knob, said rotary switch assembly having a plurality of contact pairs which selectively complete a galvanic connection across predetermined pairs of said switching terminals;
   said rotary switch assembly further including first and second switch members located in opposition on respective sides of said circuit board, each of said switch members having at least one of said contact pairs;
   wherein at least one of said first and second switch members carries an integral shaft that couples to the other of said first and second switch members such that said first and second switch members are connected together as a rotatable unit and such that rotation of one of said first and second switch members causes rotation of the other of said first and second switch members; and
   a coupling member interposed between said rotatable unit and said selector knob such that said selector knob is coupled with said rotatable unit via said coupling member, but wherein said rotatable unit is not connected to said selector knob via a common shaft.

2. A multimeter as set forth in claim 1, wherein said shaft is configured such that said first switch member and said second switch member are interconnected in a predetermined angular orientation.

3. A multimeter as set forth in claim 1, wherein said first switch member includes at least four of said contact pairs.

4. A multimeter as set forth in claim 1, wherein said second switch member includes at least three of said contact pairs.

5. A multimeter as set forth in claim 4, wherein said second switch member further includes a nonfunctional sweeper operative to facilitate balance during rotation.

6. A multimeter as set forth in claim 5, wherein said nonfunctional sweeper arrangement includes a pair of parallel sweeper members.

7. A multimeter as set forth in claim 1, wherein said coupling member comprises a detent disc located on an inside surface of said case, said detent disc interconnecting said selector knob and said first switch member for rotation about a common rotational axis.

8. A multimeter as set forth in claim 7, wherein said selector knob includes a coupling structure engaging said detent disc such that said selector knob and said detent disc rotate together.

9. A multimeter as set forth in claim 8, wherein said detent disc and said first switch member are interconnected via a plurality of drive pins offset from but parallel to said common rotational axis.

10. A multimeter as set forth in claim 9, wherein said detent disc and said first switch member each include a visual alignment feature to facilitate assembly.

11. A multimeter as set forth in claim 1, wherein each of said first and second switch members comprise a support disc in which said contact pairs are carried, said support disc being formed of a polymeric material.

12. A multimeter as set forth in claim 11, wherein each of said support discs defines at least one punch-out aperture at which adjacent contact pairs are disconnected.

13. A multimeter as set forth in claim 1, wherein the connection between said coupling member and said rotatable unit is offset from the axis of rotation of said rotatable unit.

14. A rotary switch assembly for use in an electronic metering device, said assembly comprising:
   a selector knob;
   a generally planar substrate board having conductive pads thereon defining multiple switching terminals;
   first and second switch members located on respective sides of said substrate board, said switch members operatively connected with said selector knob for rotation about a common rotational axis;
   said switch members each configured having a support disc formed of a polymeric material in which a plurality of contact pairs are carried, said contact pairs being operative to complete a galvanic connection across predetermined pairs of said switching terminals;
   wherein at least one of said first and second switch members carries an integral shaft that couples to the other of said first and second switch members such that said first and second switch members are connected together as a rotatable unit and such that rotation of one of said first and second switch members causes rotation of the other of said first and second switch members; and
   a coupling member interposed between said rotatable unit and said selector knob such that said selector knob is coupled with said rotatable unit via said coupling member, but wherein said rotatable unit is not connected to said selector knob via a common shaft.

15. A rotary switch assembly as set forth in claim 14, wherein said shaft is configured such that said first switch member and said second switch member are interconnected in a predetermined angular orientation.

16. A rotary switch assembly as set forth in claim 14, wherein said second switch member further includes a nonfunctional sweeper operative to facilitate balance during rotation.

17. A rotary switch assembly as set forth in claim 16, wherein said nonfunctional sweeper includes a pair of parallel sweeper members.

18. A rotary switch assembly as set forth in claim 14, wherein said coupling member comprises a detent disc interconnecting said selector knob and said first switch member for rotation about a common rotational axis.

19. A rotary switch assembly as set forth in claim 14, wherein the connection between said coupling member and said rotatable unit is offset from the axis of rotation of said rotatable unit.

* * * * *